(12) United States Patent
Yang

(10) Patent No.: US 7,556,897 B2
(45) Date of Patent: *Jul. 7, 2009

(54) METHODS OF FORMING RETICLES

(75) Inventor: Baorui Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/196,144

(22) Filed: Aug. 21, 2008

(65) Prior Publication Data

US 2008/0305413 A1  Dec. 11, 2008

Related U.S. Application Data

(63) Continuation of application No. 11/453,425, filed on Jun. 14, 2006, now Pat. No. 7,432,025, which is a continuation of application No. 10/915,936, filed on Aug. 10, 2004, now Pat. No. 7,442,472.

(51) Int. Cl.
  *G03F 1/00* (2006.01)
(52) U.S. Cl. .......................................... 430/5
(58) Field of Classification Search ........ 430/5
  See application file for complete search history.

(56) References Cited

U.S. PATENT DOCUMENTS

| | | | |
|---|---|---|---|
| 5,741,613 A | 4/1998 | Moon et al. | |
| 5,851,702 A | 12/1998 | Watanabe et al. | |
| 6,183,915 B1 | 2/2001 | Rolfson | |
| 6,440,613 B1 | 8/2002 | Doan | |
| 6,830,853 B1 * | 12/2004 | Tzu et al. | 430/5 |
| 7,122,453 B2 | 10/2006 | Baggenstoss | |
| 2004/0063002 A1* | 4/2004 | Wu et al. | 430/5 |
| 2006/0051974 A1 | 3/2006 | French et al. | |

OTHER PUBLICATIONS

Resnick et al., "Initial Study of the Fabrication of Step and Flash Imprint Lithography Templates For The Printing of Contact Holes"; J. Microlith., Microfab., Microsyst., vol. 3, No. 2; Apr. 2004; pp. 316-321.

* cited by examiner

*Primary Examiner*—Mark F Huff
*Assistant Examiner*—Stewart A Fraser
(74) *Attorney, Agent, or Firm*—Wells St. John P.S.

(57) ABSTRACT

The invention includes reticle constructions and methods of forming reticle constructions. In a particular aspect, a method of forming a reticle includes provision of a reticle substrate having a defined main-field region and a defined boundary region. The substrate has a relatively transparent base and a relatively opaque material over the base. A thickness of the relatively opaque material of the main-field region is reduced relative to a thickness of the relatively opaque material of the boundary region. A reticle construction of the present invention can comprise a relatively transparent base, and a relatively opaque material over the base. The construction can have a defined main-field region and a defined boundary region, and the relatively opaque material of the main-field region can have a reduced thickness relative to the relatively opaque material of the boundary region.

10 Claims, 12 Drawing Sheets

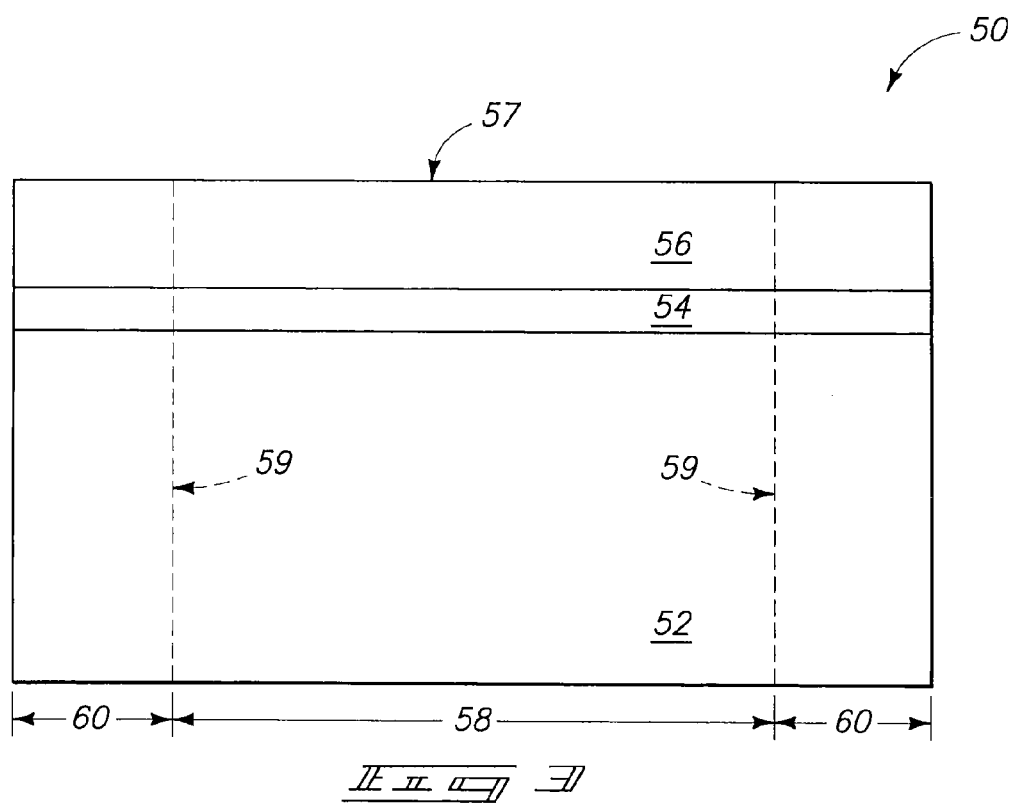
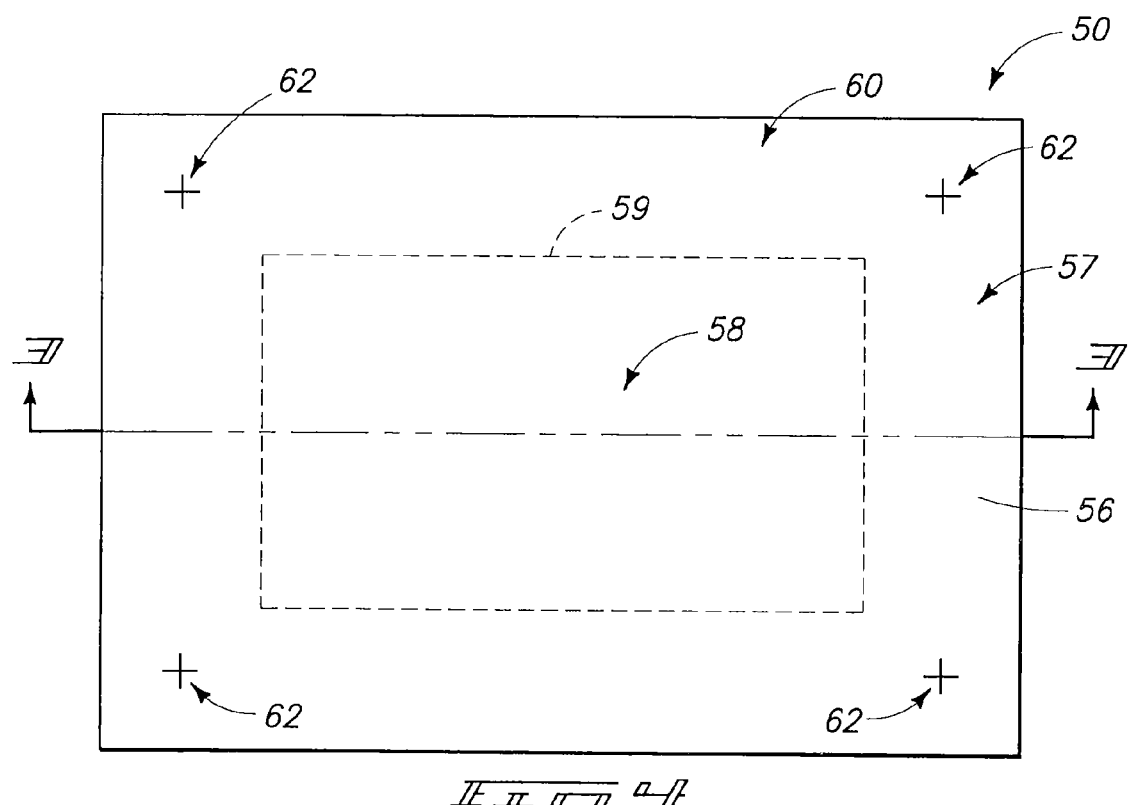

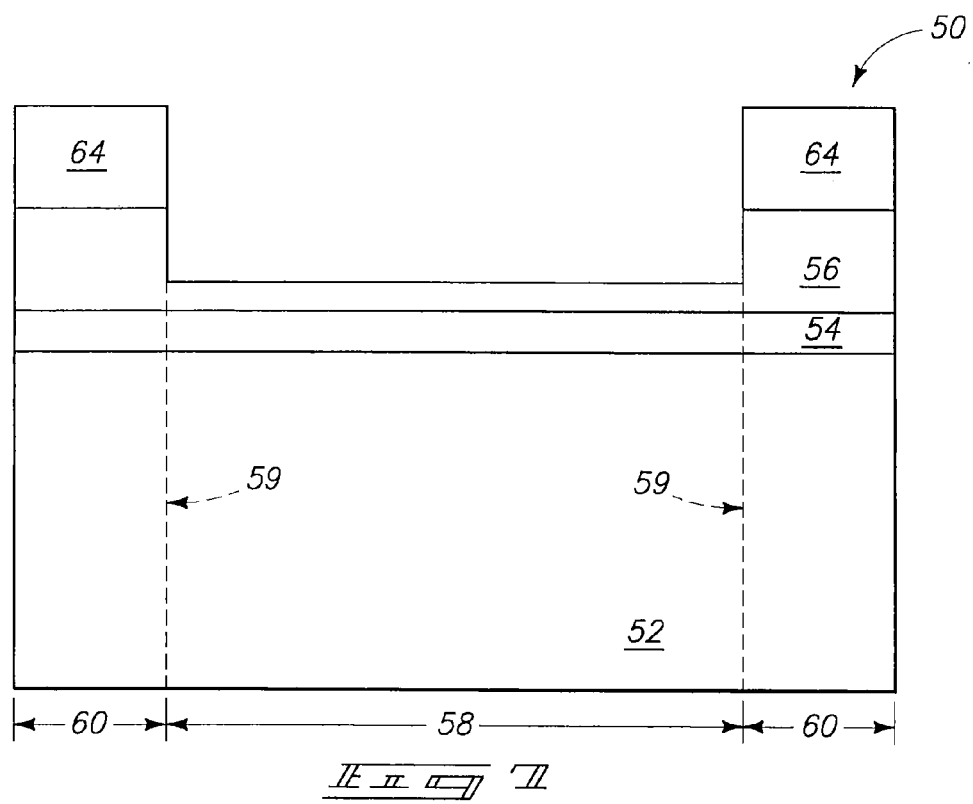
_Fig. 7_
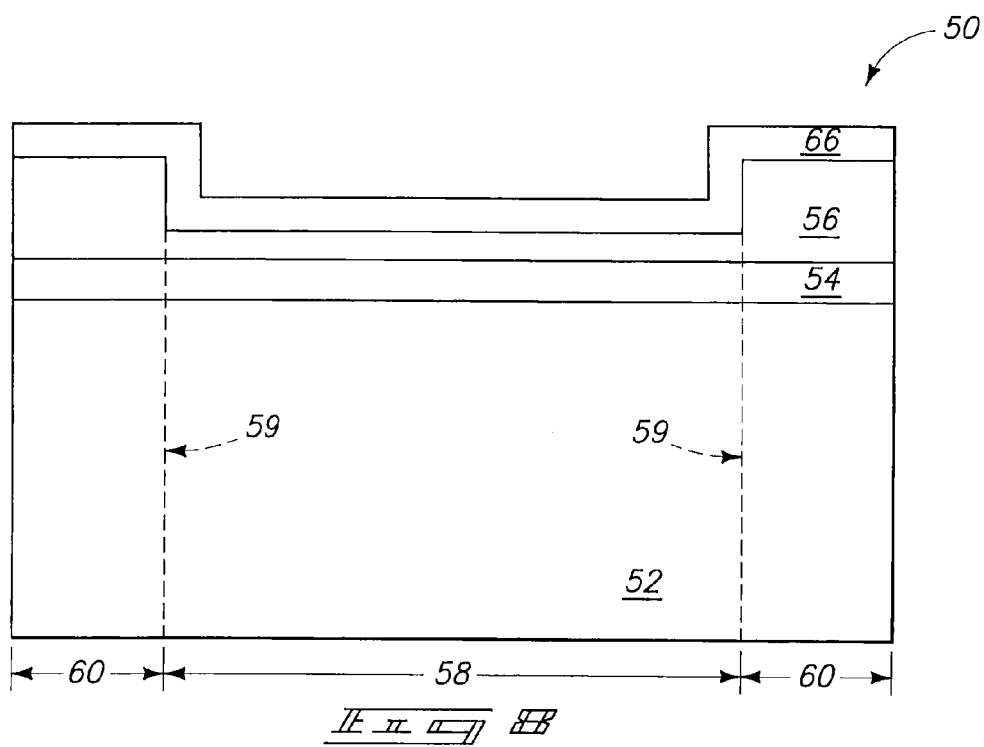
_Fig. 8_

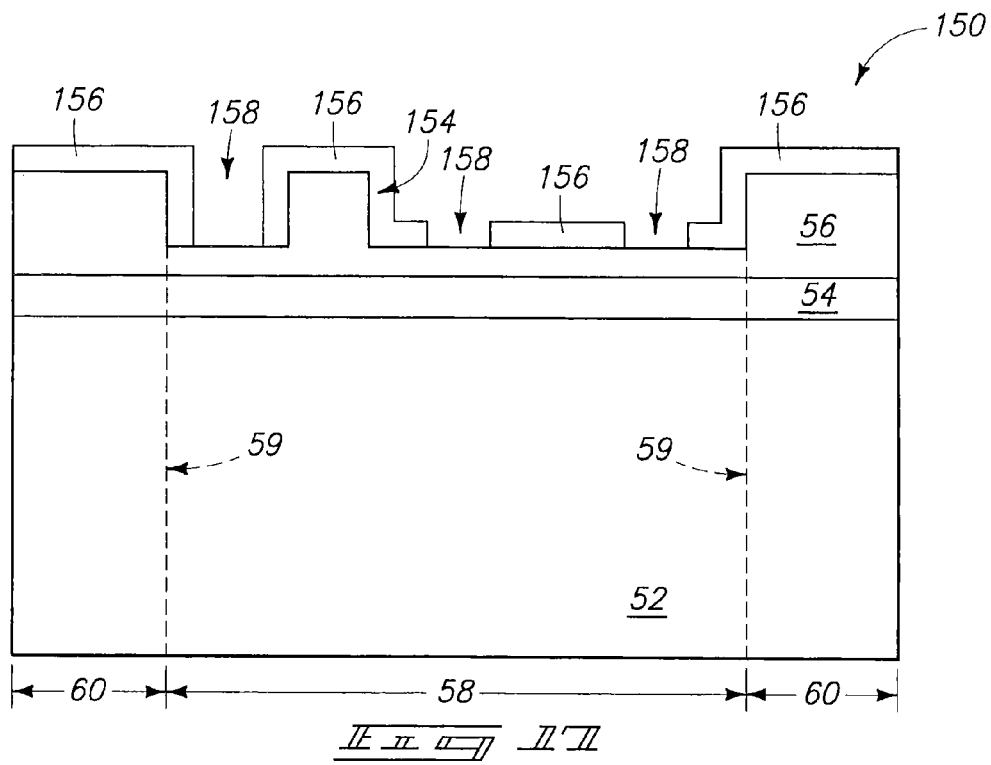
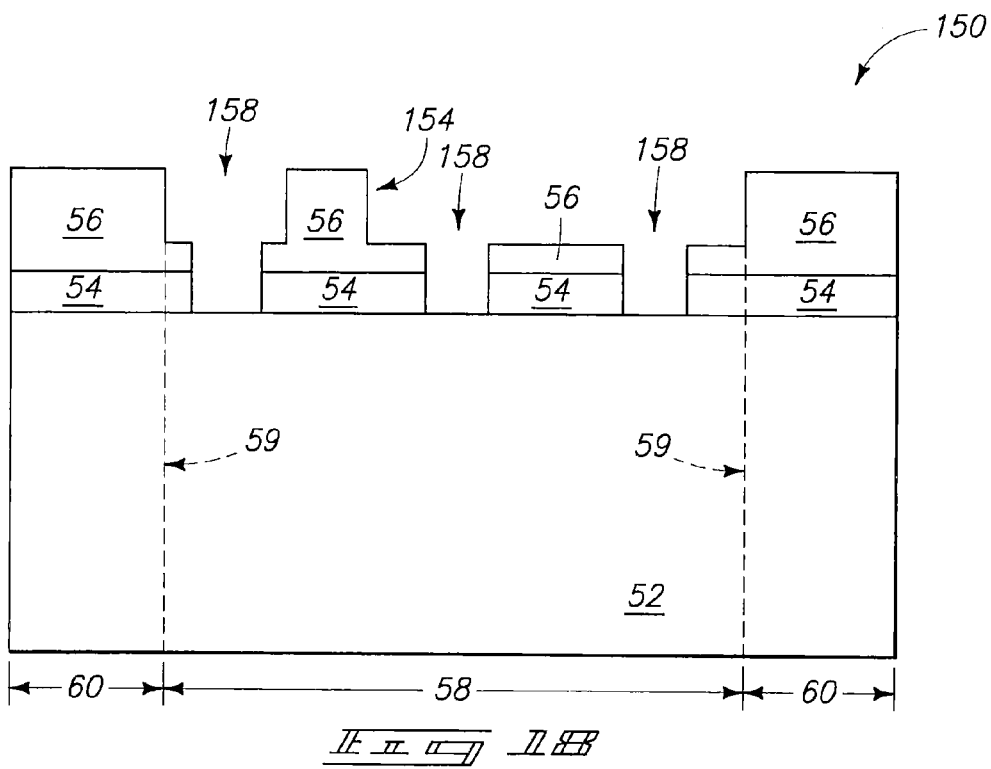

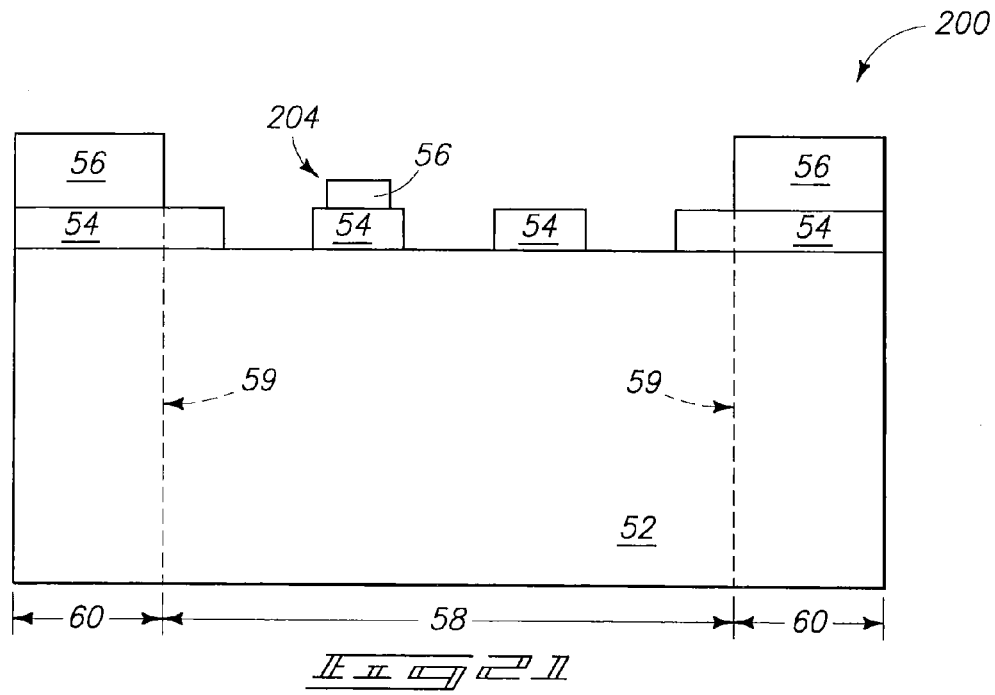
_Fig. 21_
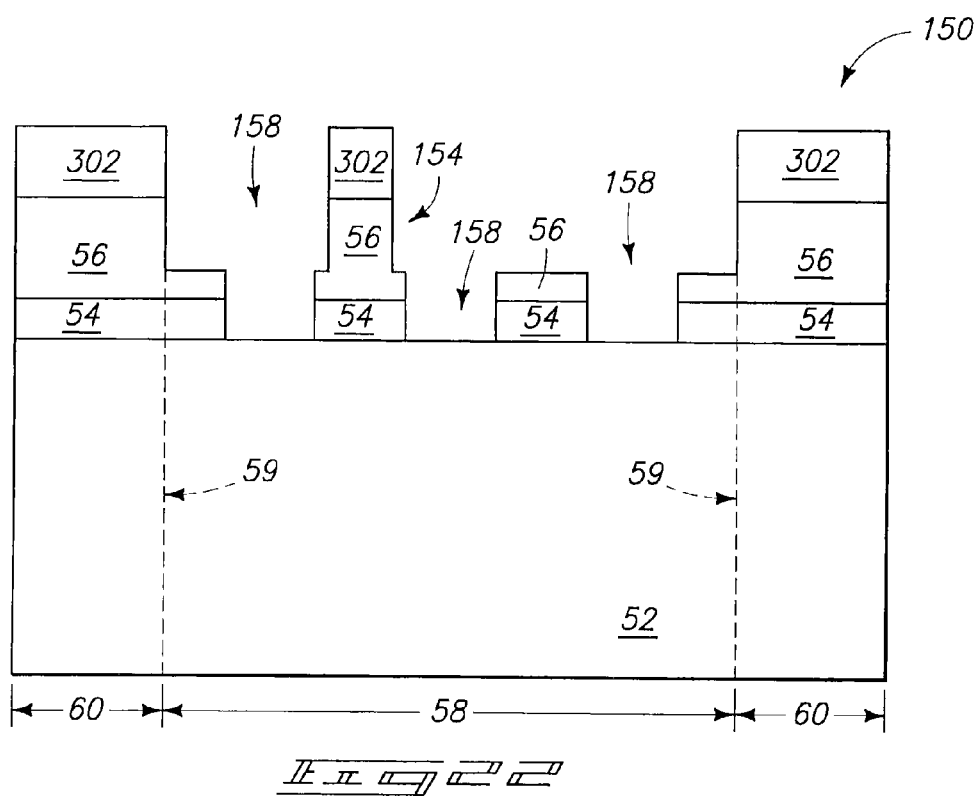
_Fig. 22_

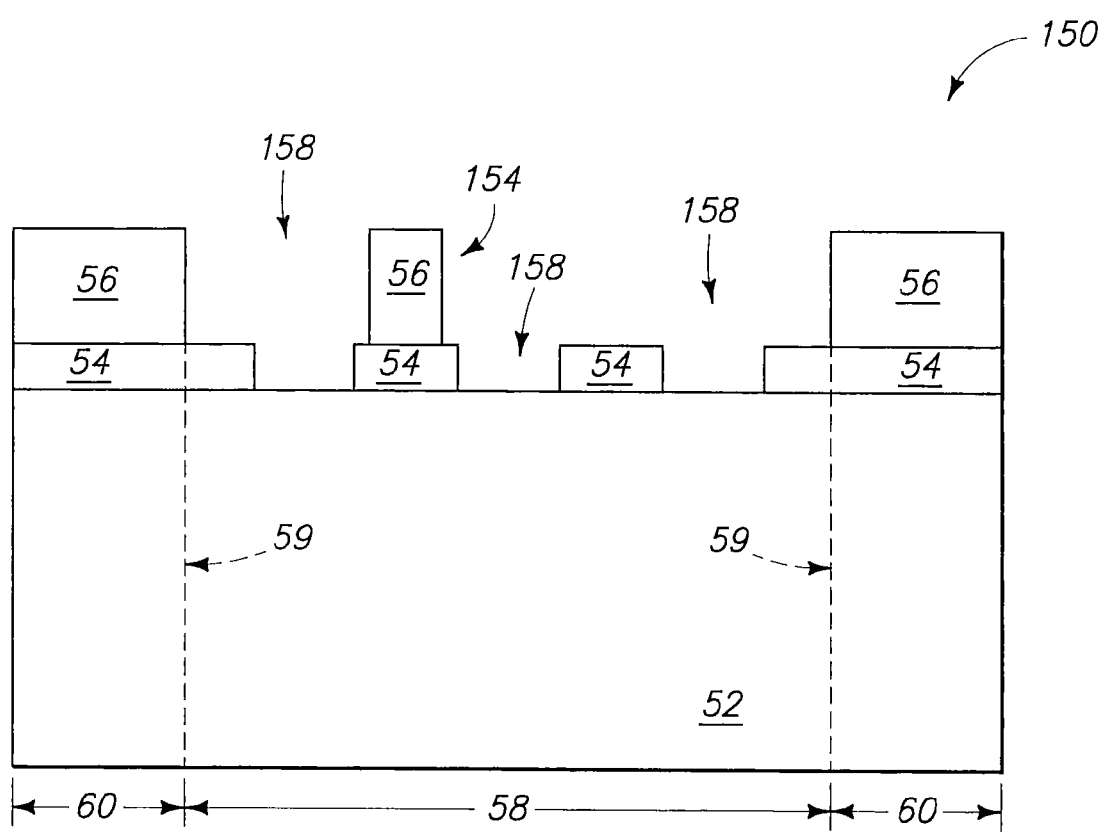
_FIG 23_

METHODS OF FORMING RETICLES

RELATED PATENT DATA

This patent resulted from a continuation of U.S. patent application Ser. No. 11/453,425, which was filed on Jun. 14, 2006, which issued as U.S. Pat. No. 7,432,025, and which is hereby incorporated herein by reference; which resulted from a continuation of U.S. patent application Ser. No. 10/915,936, which was filed on Aug. 10, 2004, which issued as U.S. Pat. No. 7,442,472, and which is hereby incorporated herein by reference.

TECHNICAL FIELD

The invention pertains to methods of forming reticles, and also pertains to reticle constructions.

BACKGROUND OF THE INVENTION

Radiation patterning tools are utilized during semiconductor processing to pattern radiation (such as, for example, ultraviolet light). The patterned radiation is projected against a radiation-imageable material (such as, for example, photoresist) and utilized to create a pattern in the radiation-imageable material. The utilization of patterned radiation for forming a desired pattern in a radiation-imageable material is typically referred to as photolithography. The radiation-patterning tools can be referred to as photomasks or reticles. The term "photomask" is traditionally understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the term "reticle" is utilized to generally refer to any radiation-patterning tool, regardless of whether the tool is utilized to pattern an entirety of a substrate or only a portion of the substrate.

An exemplary method of utilizing a reticle to pattern radiation is described with reference to FIG. 1. A reticle construction 10 is shown provided above a semiconductor substrate 12. The substrate 12 has a radiation-imageable material 14 thereover. Radiation 16 is passed through reticle construction 10. The radiation is patterned by construction 10 to form a desired radiation pattern which is directed toward radiation-imageable material 14 and ultimately is utilized to form a desired image within the radiation-imageable material. The desired image can include a pattern for forming semiconductor circuit elements, such as, for example, a pattern which can be transferred to one or more materials underlying the radiation-imageable material 14 to form patterned electrically conductive circuit elements (for instance, source/drain regions, wordlines, bitlines, capacitor electrodes, etc.) and/or patterned electrically insulative circuit elements (for instance, gate dielectric, capacitor dielectric, etc.).

The reticle construction 10 comprises a base 18, projecting features 20, and windows 22 between the projecting features. The projecting features can comprise phase-shifting material (such as, for example, silicon nitride, silicon oxynitride, molybdenum silicide and/or $Mo_wSi_xN_yO_z$, where w, x, y and z are numbers greater than zero), and/or opaque material (such as, for example, chromium). The projecting features 20 and the windows 22 together create the pattern in the radiation passing through reticle construction.

Only a fragment of the reticle construction 10 is shown in FIG. 1, and such fragment is part of a so-called main-field portion of the reticle. The main-field portion is a part of the reticle having windows therein for patterning radiation to ultimately form circuit elements associated with a semiconductor assembly. The reticle will typically also have a boundary portion extending around the main-field portion. The boundary portion has the primary function of blocking the light, but can have some patterned regions therein corresponding to non-circuit elements (i.e., patterned regions which do not form circuit elements associated with a semiconductor assembly). The patterned regions can be utilized for, among other things, calibration and mask alignment.

FIG. 2 shows a view from the bottom of the reticle construction 10, and diagrammatically illustrates the full construction to show that the reticle comprises a main-field region 30 containing the projecting features 20 and windows 22, and comprises a boundary region 32 surrounding the main-field region. The boundary region 32 will typically be covered by an opaque material (such as, for example, chromium) so that the boundary region blocks light from passing therethrough.

A continuing goal of semiconductor fabrication is to increase the density of structures formed across a semiconductor substrate (i.e., to increase the level of integration), which spawns a continuing goal to improve fabrication of the reticles utilized for patterning semiconductor substrates. Accordingly, it is desired to develop improved reticle constructions, and improved methods for forming reticle constructions.

SUMMARY OF THE INVENTION

In one aspect, the invention encompasses a method of forming a reticle. A reticle substrate is provided. The reticle substrate has a relatively transparent base and a relatively opaque material over the base. The substrate comprises a main-field region where windows utilized for patterning circuit elements of semiconductor constructions are to be formed, and a boundary region where windows utilized for patterning circuit elements of semiconductor constructions will not be formed. The main-field region has a lateral periphery, and the boundary region surrounds an entirety of the lateral periphery of the main-field region. A thickness of a majority of the relatively opaque material of the main-field region is reduced relative to a thickness of the majority of the relatively opaque material of the boundary region.

In one aspect, the invention encompasses a method of forming a reticle. A reticle substrate is provided which has a relatively transparent base, a phase-shifting material over the base, and a relatively opaque material over the phase-shifting material. The substrate comprises a defined main-field area having a lateral periphery, and a defined boundary area surrounding an entirety of the lateral periphery of the main-field area. The relatively opaque material within the main-field and boundary areas is defined to be first and second portions of the relatively opaque material, respectively. A first mask is provided which covers a region of the second portion of the relatively opaque material and leaves a region of the first portion exposed. The exposed relatively opaque material is thinned while the remainder of the relatively opaque material is protected with the mask. The utilization of the first mask during the thinning of the relatively opaque material can be referred to as first level processing, and areas of the boundary region containing non-primary patterns can also be exposed and thinned during the first level processing. The mask is removed, and thereafter a second mask is formed and patterned over the main-field area. The second mask can also be formed and patterned over the boundary area. The pattern from the second mask is transferred into the main-field area to pattern the phase-shifting material.

In one aspect, the invention encompasses an intermediate construction for fabrication of a reticle. The construction includes a relatively transparent base, and a relatively opaque material over the base. The construction is divided between a main-field region where windows utilized for patterning circuit elements of semiconductor constructions are to be formed, and a boundary region where windows utilized for patterning circuit elements of semiconductor constructions will not be formed. The main-field region has a lateral periphery, and the boundary region surrounds an entirety of the lateral periphery of the main-field region. A majority of the relatively opaque material of the main-field region has a reduced thickness relative to a majority of the relatively opaque material of the boundary region.

In one aspect, the invention encompasses a reticle construction. The construction includes a relatively transparent base, a phase-shifting material over the base, and a relatively opaque material over the phase-shifting material. The construction is divided amongst a main-field region where windows utilized for patterning semiconductor constructions extend through the phase-shifting material, and a boundary region which lacks windows utilized for patterning semiconductor constructions. The main-field region has a lateral periphery, and the boundary region surrounds an entirety of the lateral periphery of the main-field region. The majority of the boundary region has the relatively opaque material, and a minority of the main-field region has the relatively opaque material. The relatively opaque material of the main-field region is associated with a relatively opaque blocker, and is thinner than the relatively-opaque material of the boundary region. The invention can also include aspects in which at least some of the blockers have thickness of the relatively-opaque material which are about the same as the thickness of the relatively-opaque material of the majority of the boundary region.

BRIEF DESCRIPTION OF THE DRAWINGS

Preferred embodiments of the invention are described below with reference to the following accompanying drawings.

FIG. 3 is a diagrammatic, cross-sectional view of a reticle construction shown at a preliminary processing stage of an exemplary aspect of the present invention.

FIG. 4 is a diagrammatic view of a surface of the reticle construction shown at the processing stage of FIG. 3, with the cross-section of FIG. 3 being along the line 3-3 of FIG. 4.

FIG. 7 is a view of the FIG. 3 cross-section shown at a processing stage subsequent to that of FIG. 5.

FIG. 8 is a view of the FIG. 3 cross-section shown at a processing stage subsequent to that of FIG. 7.

FIG. 17 is a view of the FIG. 3 cross-section shown at a processing stage subsequent to that of FIG. 16.

FIG. 18 is a view of the FIG. 3 cross-section shown at a processing stage subsequent to that of FIG. 17.

FIG. 21 is a view of the FIG. 3 cross-section shown at a processing stage subsequent to that of FIG. 20.

FIG. 22 is a view of the FIG. 3 cross-section shown at a processing stage subsequent to that of FIG. 18 in accordance with a fourth aspect of the invention.

FIG. 23 is a view of the FIG. 3 cross-section shown at a processing stage subsequent to that of FIG. 22.

DETAILED DESCRIPTION OF THE PREFERRED EMBODIMENTS

Figure 1:
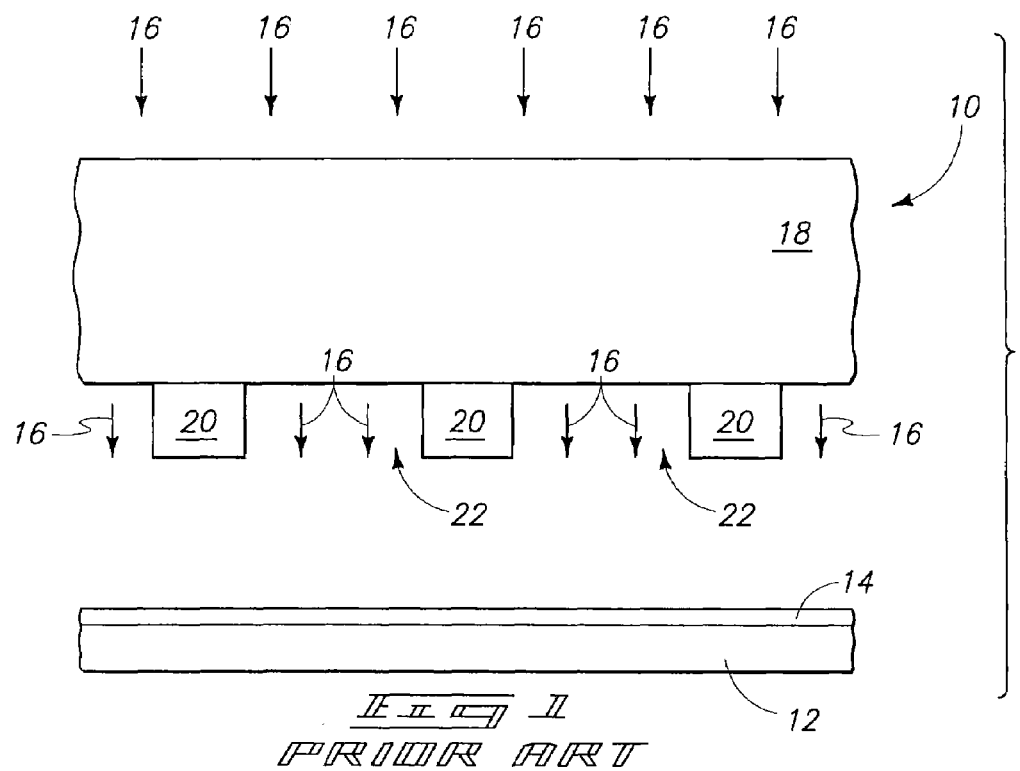
FIG. 1 is a diagrammatic, cross-sectional view of a reticle construction and a semiconductor construction, with the reticle construction shown being utilized to pattern radiation directed toward the semiconductor construction in accordance with a prior art process.
Figure 2:
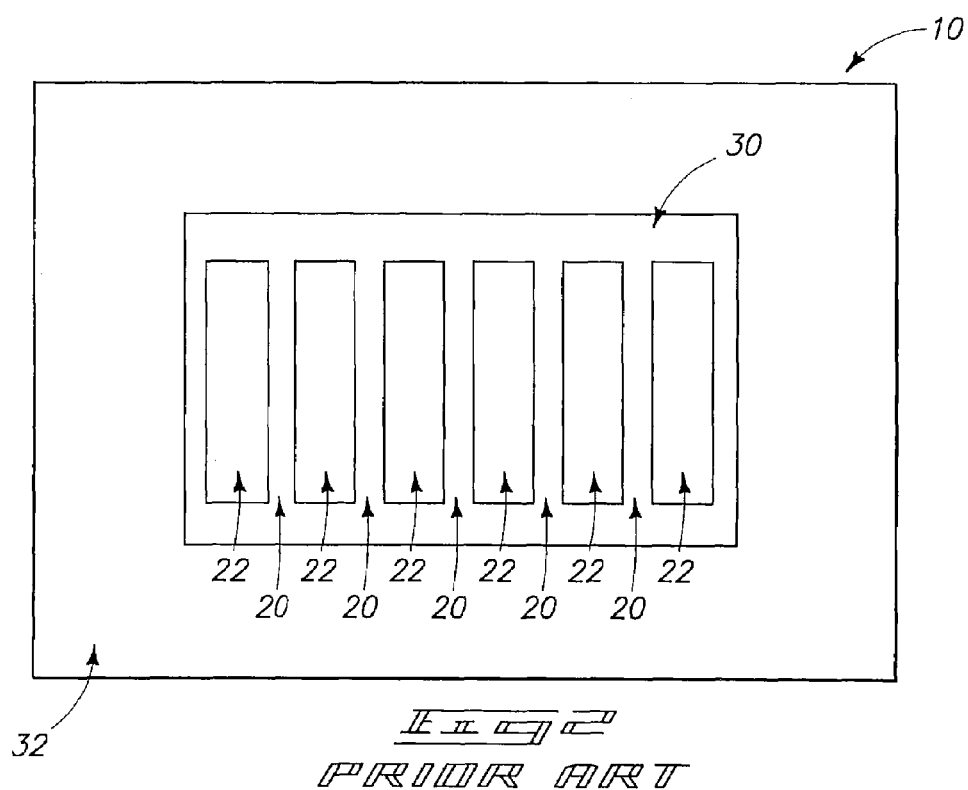
FIG. 2 is a diagrammatic view of a surface of a prior art reticle construction.

This disclosure of the invention is submitted in furtherance of the constitutional purposes of the U.S. Patent Laws "to promote the progress of science and useful arts" (Article 1, Section 8).

One aspect of the present invention is a recognition that it can be advantageous to utilize a different thickness of a relatively opaque material (such as, for example, chromium) over a main-field region of a reticle than over a boundary region of the reticle. Specifically, it is recognized that it is generally easier to form tight-tolerance patterns through thin materials than through thicker materials, and it is recognized that the tight-tolerance patterns will generally be formed within the main-field region of a reticle construction rather than within the boundary region. It is also recognized that it can be advantageous to leave a thick portion of relatively opaque material over the boundary region of a reticle construction in that such may do a better job of blocking stray light than would a thin portion of the relatively opaque material.

An exemplary method of forming a reticle construction in accordance with an aspect of the present invention is described with reference to FIGS. 3-13.

Referring initially to FIG. 3, a reticle substrate 50 is illustrated at a preliminary processing stage. The substrate 50 comprises a relatively transparent base 52, a phase-shifting material 54 over the base, and a relatively opaque material 56 over the phase-shifting material. The term "relatively" is utilized throughout this document to indicate that a material has a particular quantitative property relative to another. For instance, the term "relatively opaque" is utilized to indicate that a material is more opaque than another material, with such other material being referred to as a "relatively transparent" material.

The relatively transparent material 52 will typically comprise, consist essentially of, or consist of quartz. The relatively opaque material 56 will typically comprise, consist essentially of, or consist of chromium. The phase-shifting material 54 will typically comprise, consist essentially of, or consist of one or more of silicon nitride, silicon oxynitride, molybdenum silicide and $Mo_wSi_xN_yO_z$, where w, x, y and z are numbers greater than zero.

The substrate of FIG. 3 is shown to comprise a main-field region 58 and a boundary region 60 around the main-field region. A dashed border 59 is provided to demarcate a boundary between the main-field region and the boundary region.

Material 56 comprises an upper surface 57, and FIG. 4 shows a view of substrate 50 along such upper surface (i.e., shows a top view of the FIG. 3 substrate). The FIG. 4 view shows main-field region 58 having a lateral periphery defined by demarcation line 59, and shows boundary region 60 entirely surrounding the lateral periphery of the main-field region. Although the shown main-field region comprises a rectangular lateral periphery, it is to be understood that the lateral periphery of the main-field region can have any suitable shape.

A series of marks 62 are provided within boundary region 60 to illustrate the exemplary locations where alignment marks can ultimately be formed. Such alignment marks can be utilized for aligning various masks utilized during the fabrication of the reticle, as well as, or alternatively for aligning the reticle during utilization of the reticle to pattern light during semiconductor fabrication.

It is noted that the demarcation 59 between the main-field and boundary regions of the substrate is provided for illustrative purposes, and frequently the border between the main-field and boundary regions is not a well-defined line. Regardless, persons of ordinary skill in the art will recognize that there is a main-field region of a reticle which can be defined as a region where openings will ultimately be formed for generating a circuit element pattern within a radiation-imageable material during a semiconductor fabrication process, and that such main-field region will be spaced from the edges of the reticle by a region which is not utilized to generate circuit element patterns within the radiation-imageable material. Persons of ordinary skill in the art will also recognize that the spacing between the main-field region and the edge of the reticle is a boundary region, and that such boundary region will typically extend entirely around the main-field region as is diagrammatically illustrated in FIGS. 3 and 4.

Figure 5:
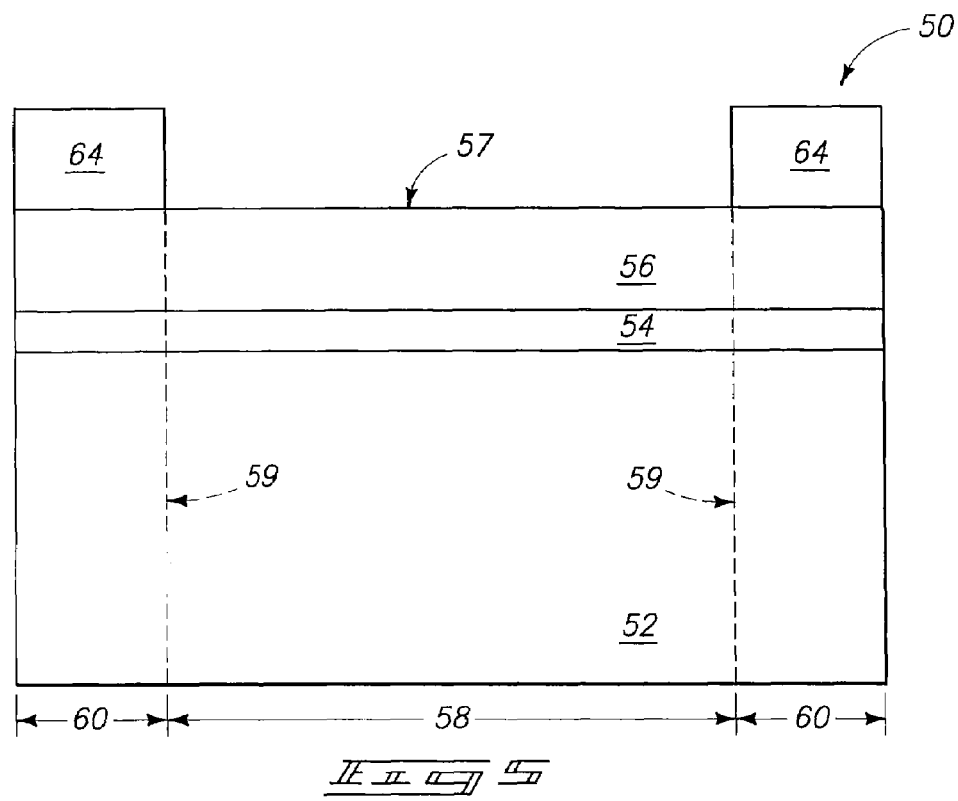
FIG. 5 is a diagrammatic, cross-sectional view of the FIG. 3 construction shown at a processing stage subsequent to that of FIG. 3.
Figure 6:
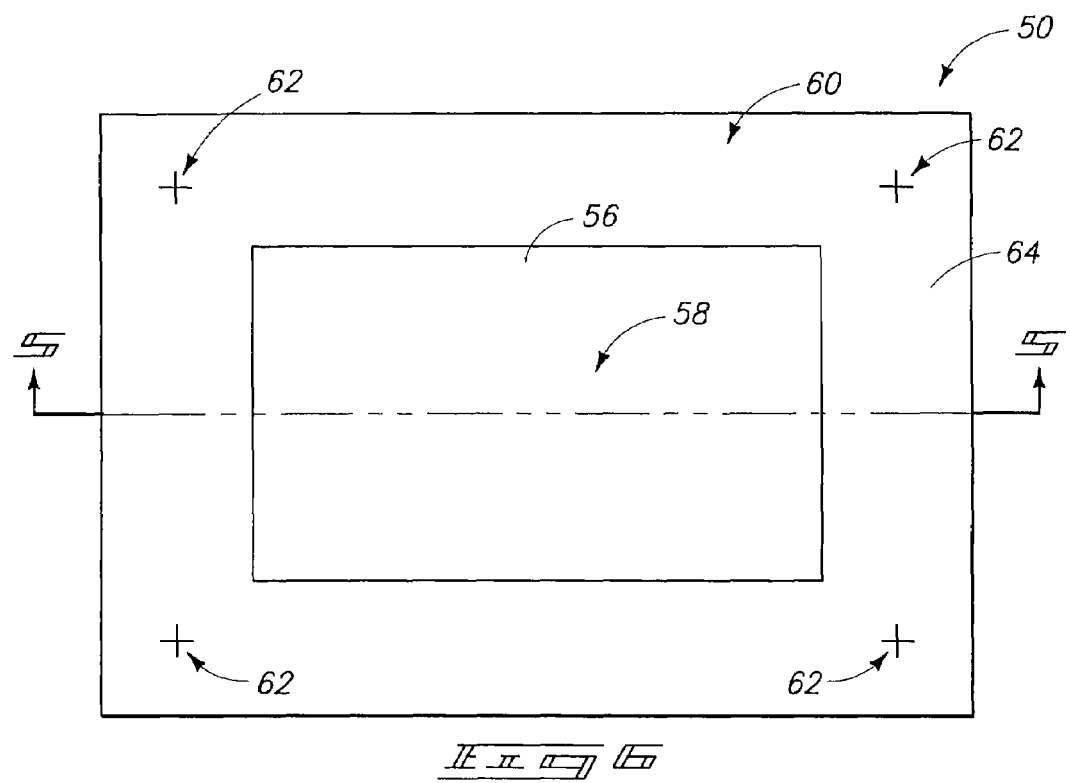
FIG. 6 is a view of a surface of the reticle construction at the processing stage of FIG. 5, with the cross-section of FIG. 5 extending along the line 5-5 of FIG. 6.

Referring next to FIGS. 5 and 6, a patterned mask 64 is formed over the upper surface 57 of relatively opaque material 56. Mask 64 can comprise, consist essentially of, or consist of, for example, photoresist, and can be formed into the shown pattern utilizing photolithographic processing.

Relatively opaque material 56 can be considered to comprise a first portion within main-field 58, and a second portion within boundary region 60. Patterned mask 64 can cover a majority of the second portion of the relatively opaque material 56 while leaving a majority of the first portion of such relatively opaque material uncovered. In the shown aspect, the mask covers an entirety of the portion of the relatively opaque material 56 within boundary region 60, and leaves an entirety of the relatively opaque material 56 within main-field region 58 uncovered (i.e., exposed). The locations 62 of the alignment markings are shown in FIG. 6 to illustrate an optional aspect in which the patterned mask 64 covers all of the material 56 within the boundary region 60 except for locations 62 where alignment marks are to be formed.

Referring next to FIG. 7, a pattern is transferred from mask 64 to the underlying material 56. Such reduces a thickness of the relatively opaque material of the main-field region 58 relative to a thickness of the relatively opaque material of the boundary region 60. If the locations of the alignment marks 62 (FIG. 6) are exposed during such etch, the locations of the alignment marks within boundary region 60 will also be reduced in thickness.

Although an entirety of the material 56 within main-field region 58 is shown being reduced in thickness, it is to be understood that the invention encompasses other aspects in which some of the material of main-field region 58 is protected by the patterned mask (discussed in more detail below with reference to FIGS. 15 and 16), and accordingly wherein only some of the material within the main-field region is reduced in thickness during the processing of FIG. 7. Regardless, there will typically be a majority of the relatively opaque material 56 within the main-field region which is reduced in thickness relative to a majority of the relatively opaque material 56 of the boundary region.

Referring to FIG. 8, the patterned mask 64 (FIG. 7) is removed, and masking material 66 is formed over the relatively opaque material 56. Masking material 66 can comprise, consist essentially of, or consist of, for example, photoresist.

Figure 9:
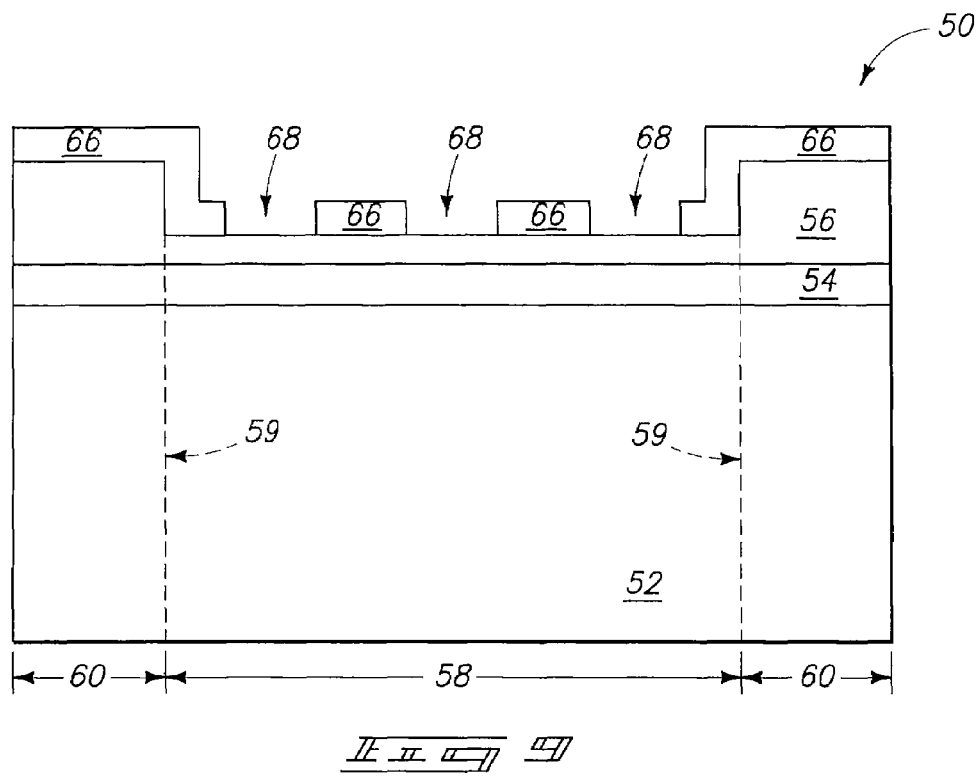
FIG. 9 is a view of the FIG. 3 cross-section shown at a processing stage subsequent to that of FIG. 8.

Referring to FIG. 9, a pattern is formed within masking material 66, and specifically openings 68 are formed to extend through the material 66 within the main-field region 58. The patterning of material 66 can be accomplished by, for example, photolithographic processing. The patterned material 66 forms a patterned mask over material 56. The patterned material 64 (discussed above with reference to FIGS. 5 and 6), and the patterned material 66 can be referred to as first and second patterned masks, respectively, to distinguish the patterned masks from one another.

Figure 10:
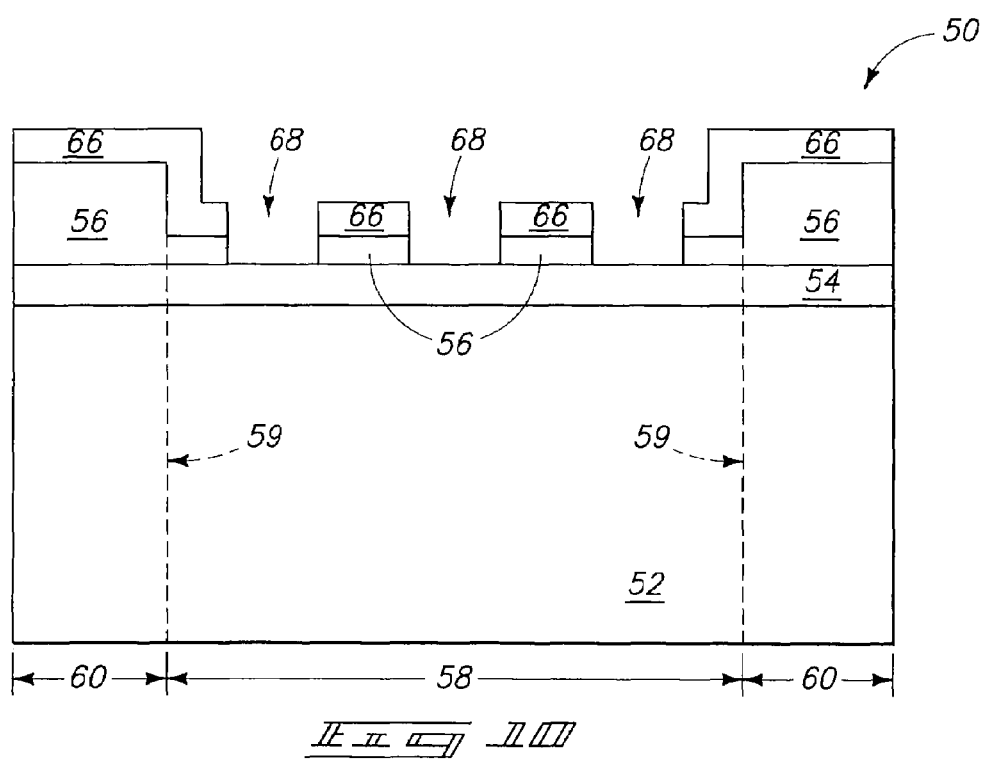
FIG. 10 is a view of the FIG. 3 cross-section shown at a processing stage subsequent to that of FIG. 9.

Referring next to FIG. 10, openings 68 are extended into relatively opaque material 56 with a suitable etch, and accordingly a pattern from the patterned mask of material 66 is transferred into the material 56 of the main-field region.

The thinning of material 56 of the main-field region can provide numerous advantages for the patterning of the material. For instance, the etch through thinned material 56 can require less time than would an etch through the original thickness of material 56. Further, etches through thin materials can typically be conducted with fewer complications and with tighter control of opening dimensions than can etches through thicker materials. Additionally, the etch through the thinned portions of material 56 can be conducted with thinner masking material 66 than can an etch through thicker portions of material 56 in many cases. This is because the etch utilized for material 56 is seldom 100% selective for material 56 relative to material 66. Accordingly, some of the masking material 66 is removed during the etching of material 56. The amount of masking material removed increases with the duration of the etch, which in turn increases with the thickness of material 56. Accordingly, the thinned material 56 can be etched with a thinner mask 66 than could a thicker material 56. The thinner mask can frequently be patterned with more stringent pattern control than can a thicker mask. For instance, if photolithographic processing is utilized to pattern a photoresist mask, the patterning can typically be conducted with more stringent control of the final pattern when the masking material 66 is thin than when the masking material 66 is thick.

Figure 11:
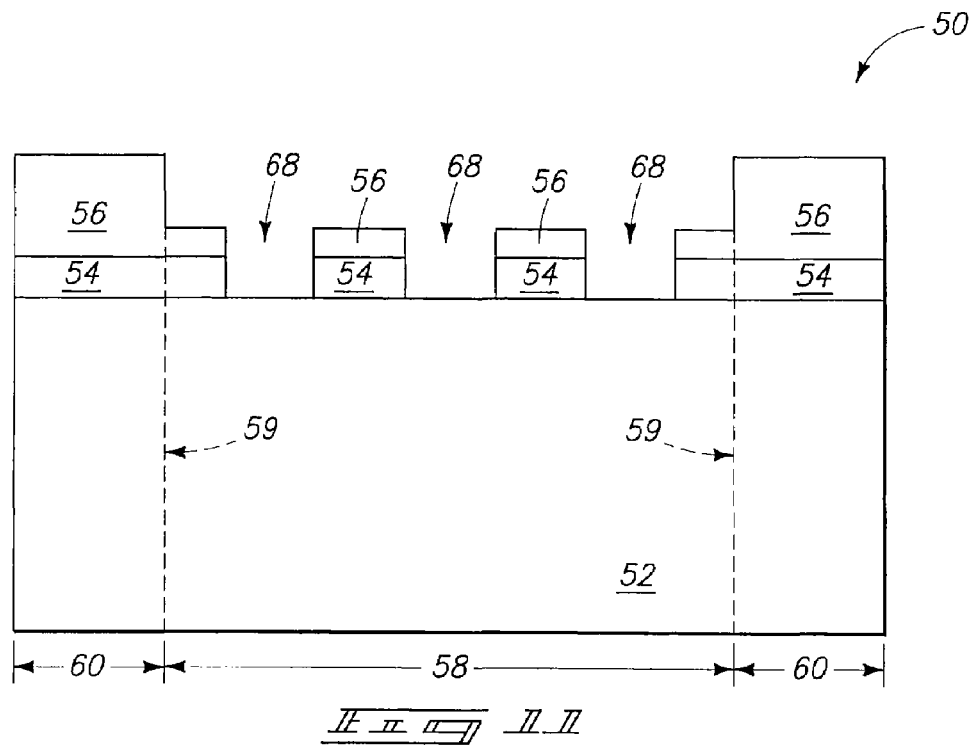
FIG. 11 is a view of the FIG. 3 cross-section shown at a processing stage subsequent to that of FIG. 10.

Referring to FIG. 11, masking material 66 (FIG. 10) is removed, and openings 68 are extended through phase-shifting material 54. In some aspects, openings 68 can be extended into material 54 prior to removal of mask 66 (FIG. 10). In other aspects, mask 66 can first be removed, and subsequently material 56 can be utilized as a hard mask during an etch to extend the openings 68 into phase-shifting material 54. Extension of the openings into material 54 can be considered a transfer of the original pattern formed within masking material 66 (FIG. 9) into main-field region 58 to pattern the phase-shifting material 54. The construction of FIG. 11 can be referred to as an intermediate construction for fabrication of a reticle.

In the shown aspect of the invention, the openings are extended to the upper surface of the relatively transparent base 52. It is to be understood, however, that the invention includes other aspects (not shown) in which at least some of the openings are extended only partially into phase-shifting material 54 so that the openings do not reach the surface of base 52, as well as aspects in which at least some of the openings are extended all the way through phase-shifting material 54 and partially into base 52.

Figure 12:
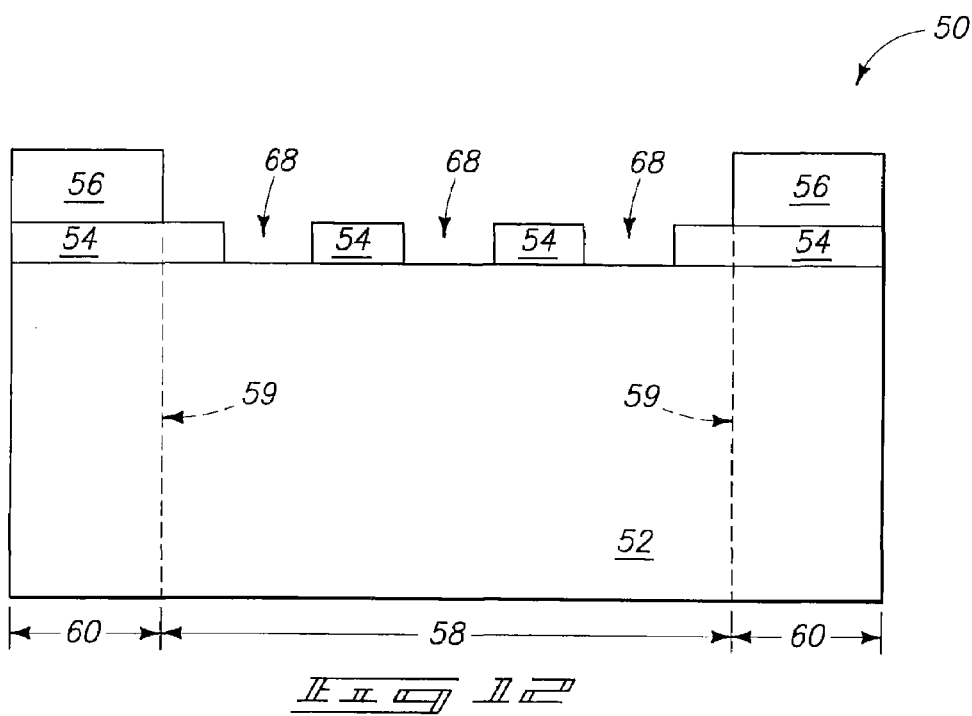
FIG. 12 is a view of the FIG. 3 cross-section shown at a processing stage subsequent to that of FIG. 11.

Referring next to FIG. 12, material 56 is subjected to an etch which removes the thinned portions of the material while leaving the thickened portions of the material. The shown etch has removed material 56 from main-field region 58, while leaving material 56 over boundary region 60.

Figure 13:
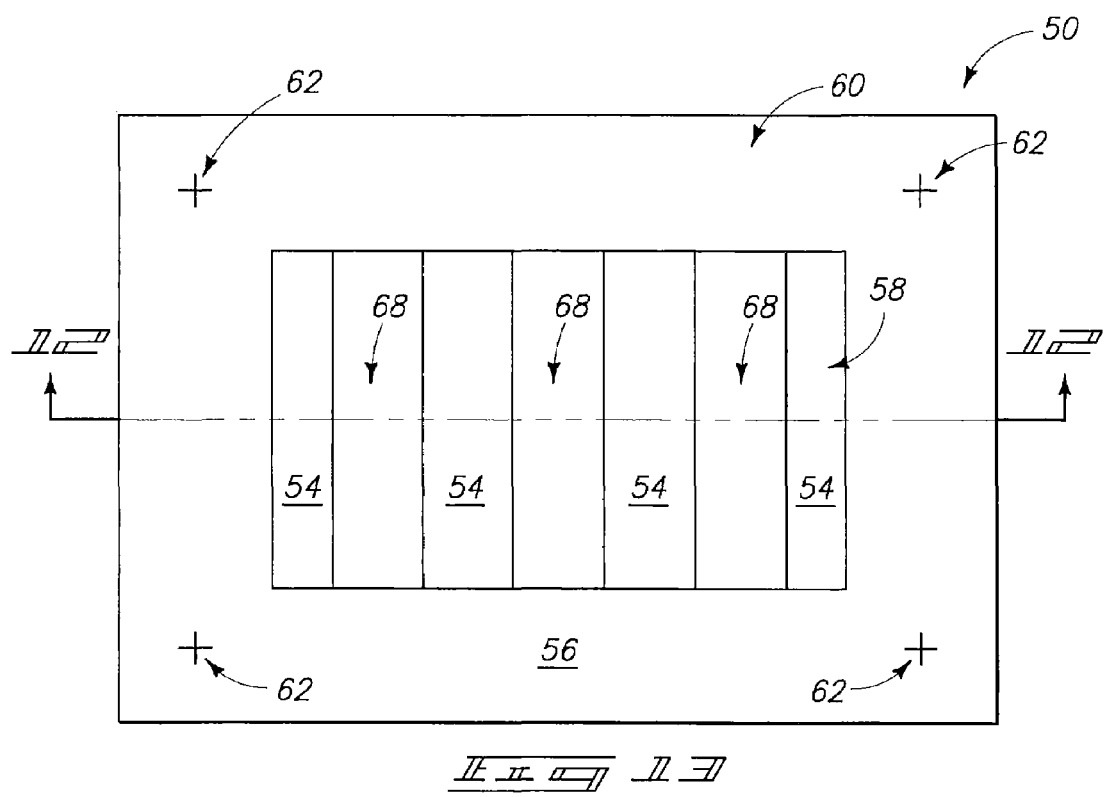
FIG. 13 is a view of a surface of a reticle construction shown at the processing stage of FIG. 12, with the cross-section of FIG. 12 being along the line 12-12 of FIG. 13.

FIG. 13 shows a top view of the construction of FIG. 12, and shows remaining phase-shifting material 54 patterned within main-field region 58 to leave windows 68 within the main-field region. Such windows can subsequently be utilized during a lithographic process, such as, for example, a process analogous to that described above with reference to prior art FIG. 1.

The features shown in FIG. 13 are for diagrammatic purposes only, and it is to be understood that the relative scale of the features to the size of the reticle is much different than that which would typically be utilized. Specifically, there would typically be orders of magnitude more individual features formed within the main-field regions of a reticle than are shown in FIG. 13.

The alignment locations 62 are shown within boundary region 60 of the FIG. 13 structure, and alignment marks can be present in such alignment locations at the processing stage of FIG. 13. The alignment marks can have been formed, for example, during the patterning conducted with the first masking material 64 (FIG. 7), and/or during the patterning conducted with the second masking material 66 (FIG. 10), and/or during other process steps which are not shown. If alignment marks are formed during the patterning of both the first and second masking materials, the locations of the alignment marks formed during the patterning of the second masking material can be at the same location as the locations of the alignment marks formed during the patterning of the first masking material or can be at different locations.

The invention can be utilized for applications in which all of the relatively opaque material 56 is removed from the main-field region. In other aspects, the invention can be applied to fabrication processes in which some of the relatively opaque material is to be left within the main-field region.

Figure 14:
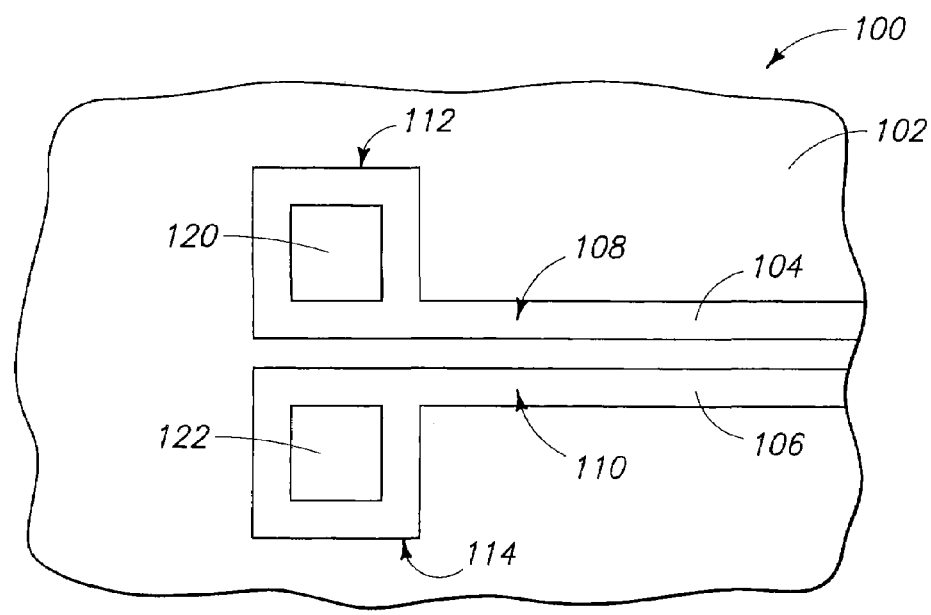
FIG. 14 is a diagrammatic, fragmentary view of a surface of a reticle construction illustrating an exemplary pattern which can be formed within the main-field of a reticle.

An exemplary application in which it is desired to leave some of the relatively opaque material within the main-field region is described with reference to FIG. 14. Specifically, FIG. 14 shows a fragmentary top view of a reticle construction 100 comprising a base 102 and a pair of circuit patterns 104 and 106 over the base. The circuit patterns 104 and 106 can, for example, correspond to patterns formed in phase-shifting material. The circuit patterns 104 and 106 comprise relatively thin and tightly packed components 108 and 110, respectively; and relatively wide (i.e., less tightly packed) features 112 and 114 respectively. Relatively opaque regions 120 and 122 are provided over the wider regions 112 and 114 to block stray-light effects and other undesired effects that may otherwise occur. In applications in which the relatively opaque material contains chromium, the components 120 and 122 can be referred to as chrome blockers. It is common for a plurality of chrome blockers to be provided within the main-field region of a reticle.

FIGS. 15-21 illustrate exemplary methodologies by which relatively opaque blockers (for example, chrome blockers) can be provided within the main-field region of a reticle while utilizing aspects of the present invention. Similar numbering will be utilized in referring to FIGS. 15-21 as was used above in referring to FIGS. 3-13, where appropriate.

Figure 15:
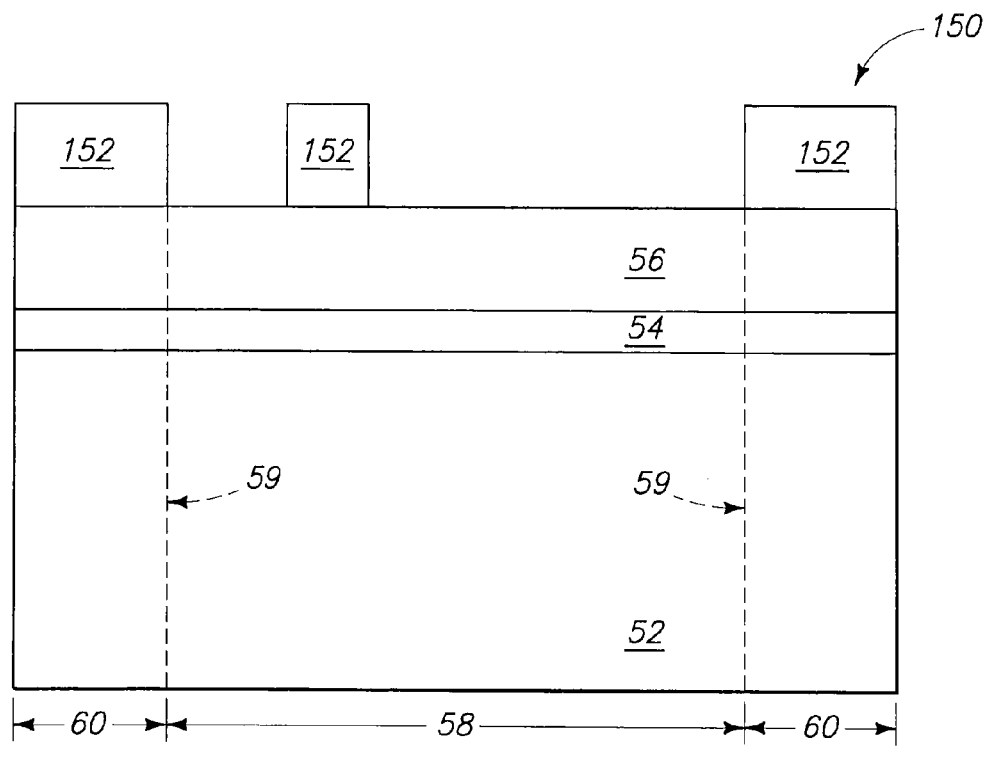
FIG. 15 is a view of the FIG. 3 cross-section shown at a processing stage subsequent to that of FIG. 3 in accordance with a second exemplary aspect of the present invention.

Referring initially to FIG. 15, such shows a reticle construction 150 comprising the base 52, phase-shifting material 54, and relatively opaque material 56 discussed previously. The reticle is divided amongst a defined main-field region 58 and the defined boundary region 60, with a border between such regions being diagrammatically illustrated with the dashed line 59.

A patterned mask of material 152 is formed over material 56. Material 152 can comprise the same masking material as described previously for material 64 of FIG. 5. The difference between the construction 150 of FIG. 15 and the construction 50 of FIG. 5 is that there is a block of the masking material over main-field region 58 of the construction 150, whereas the entirety of the main-field is uncovered in the construction 50 of FIG. 5.

Figure 16:
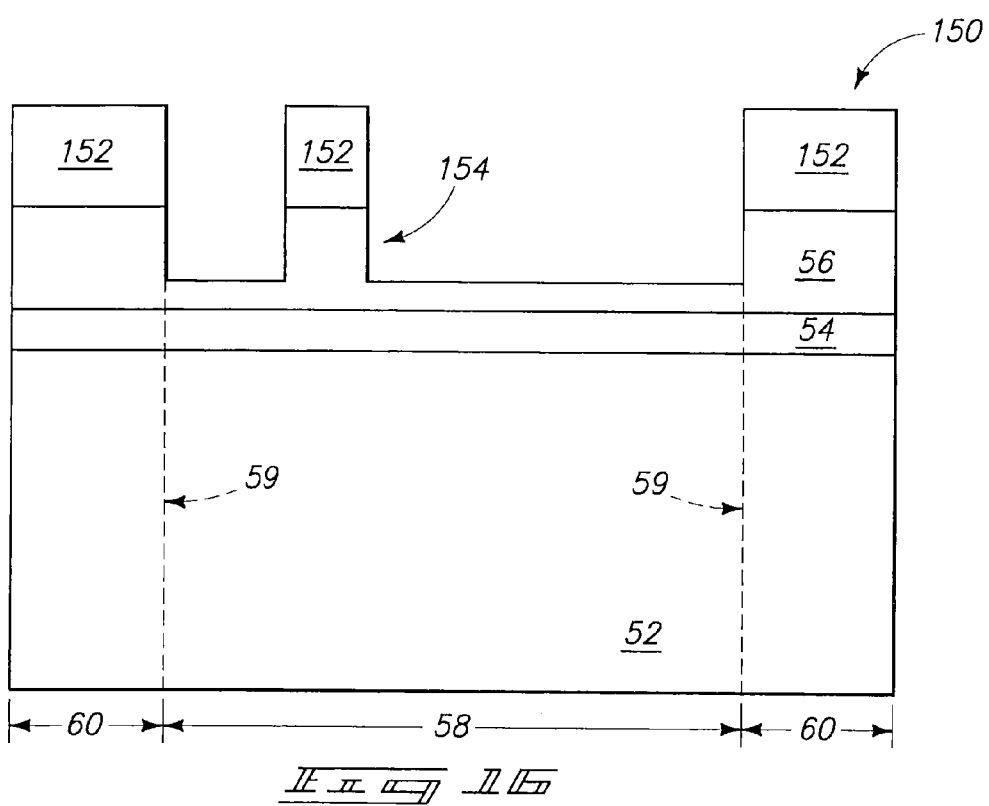
FIG. 16 is a view of the FIG. 3 cross-section shown at processing stage subsequent to that of FIG. 15.

Referring to FIG. 16, a pattern from the patterned masking material 152 is transferred to the material 56 with an appropriate etch. Such thins material 56 within the main-field region but leaves thickened projections of material 56 where the material 56 is covered by masking material 152. One of such projections (labeled 154 in FIG. 16) is shown within the main-field region. Although only one projection is shown in the main-field region, it is to be understood that there would typically be more than one of such projections in the main-field region.

Referring next to FIG. 17, masking material 152 (FIG. 16) is removed, and subsequently a patterned masking material 156 is formed over relatively opaque material 56. The masking material 156 can be identical to the material 66 discussed above with reference to FIG. 8. Patterned masking material 156 has a plurality of openings 158 extending therethrough.

Referring next to FIG. 18, the openings 158 are extended through materials 56 and 54 in processing analogous to that discussed above regarding FIGS. 10 and 11, and masking material 156 is removed.

Figure 19:
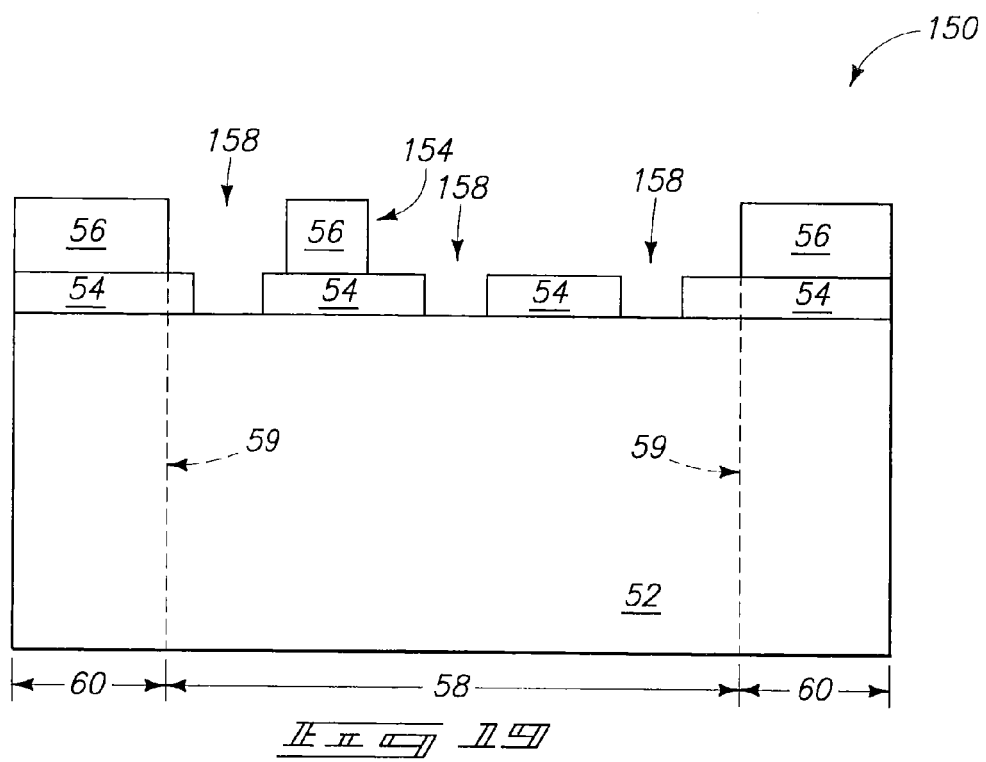
FIG. 19 is a view of the FIG. 3 cross-section shown at a processing stage subsequent to that of FIG. 18.

Referring next to FIG. 19, thinned regions of material 56 are removed in processing analogous to that discussed above with reference to FIG. 12. Such leaves a segment of material 56 extending around the boundary region 60, and also leaves a segment of material 56 within the main-field region 58 as projection 154. The projection 154 of relatively opaque material 56 can be utilized as a blocker, such as, for example, one of the blockers 120 and 122 discussed above with reference to FIG. 14.

Figure 20:
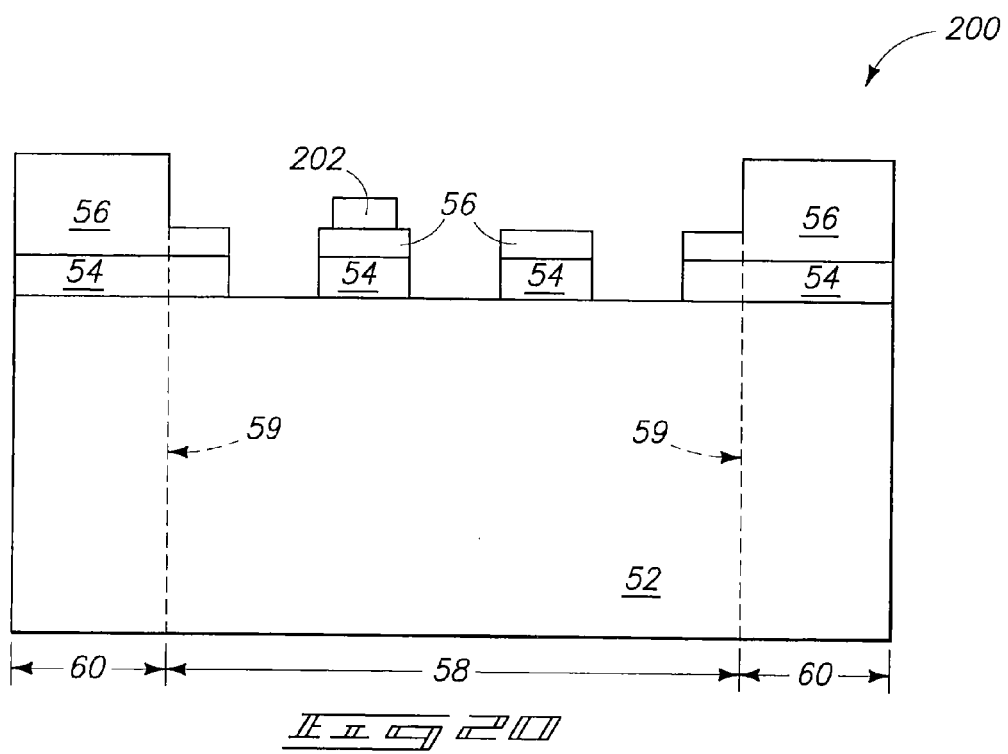
FIG. 20 is a view of the FIG. 3 cross-section shown at a processing stage subsequent to that of FIG. 11 in accordance with a third aspect of the invention.

The processing discussed above with reference to FIGS. 15-19 illustrates one exemplary method for forming a blocker in accordance with an aspect of the present invention. FIGS. 20 and 21 illustrate another exemplary method for forming a blocker.

Referring initially to FIG. 20, such shows a reticle construction 200 at a processing stage subsequent to FIG. 11. A patterned mask of material 202 has been formed over a thinned portion of relatively opaque material 56 in main-field region 58. Material 202 can comprise any suitable masking material, and in particular aspects will comprise, consist essentially of, or consist of photoresist.

Referring to FIG. 21, construction 200 is illustrated after it has been subjected to processing analogous to that discussed above with reference to FIG. 12 for removal of thinned material 56, and after subsequent removal of masking material 202. The masking material 202 has protected a portion of the thinned material 56 during the etching of the remainder of the thinned material 56. The protected portion of material 56 forms a projection 204 within the main-field region 58. Such projection can be a blocker analogous to the blockers 120 and 122 discussed above with reference to FIG. 14.

FIGS. 22 and 23 illustrate another exemplary method for removing the thinned material 56 in the main-field region and forming a blocker. FIG. 22 shows construction 150 of FIG. 18 at a processing stage subsequent to FIG. 18. Specifically a resist material 302 has been patterned to form a protective mask over some portions of material 56 while leaving other portions exposed. The material 302 can be patterned with, for example, an e-beam or laser mask pattern generation tool. The material 302 can be considered a third level, and the alignment of the third level to the underlying levels can be accomplished utilizing alignment marks built during either or both of the first and second level processes which formed the patterned material 56 of FIG. 18.

FIG. 23 shows construction 150 after exposed regions of the thinned opaque material 56 are removed, and after subsequent removal of masking material 302. The patterned material 56 of FIG. 23 has a relatively-opaque blocker over the main-field region which is approximately the same thickness as the majority of material 56 over the boundary region.

It is to be understood that processing analogous to that of FIGS. 22 and 23 can also be utilized in applications in which blockers are not formed over the main-field region.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a reticle, comprising:
providing a reticle substrate having a base, and having a chromium-containing material over the base; the substrate comprising a main-field area and a boundary area laterally surrounding the main-field area; the chromium-containing material within the main-field and boundary areas being first and second portions of the chromium-containing material, respectively;
forming a first photoresist mask which covers at least some of the second portion of the chromium-containing material and leaves at least some of the first portion of the chromium-containing material exposed, the first photoresist mask having a first thickness;
thinning the exposed chromium-containing material while protecting the remainder of the chromium-containing material with the first photoresist mask; after the thinning, at least some of the chromium-containing material within the boundary area being thicker than at least some of the chromium-containing material within the main-field area;
removing the first photoresist mask; and
after removing the first photoresist mask, forming a second photoresist mask which is patterned over the thinned chromium-containing material across the main-field area, the second photoresist mask having a second thickness which is less than the first thickness.

2. A method of forming a reticle, comprising:
providing a reticle substrate having a base, a first material over the base, and a chromium-containing material over the first material; the substrate comprising a main-field area and a boundary area laterally surrounding the main-field area; the chromium-containing material within the main-field and boundary areas being first and second portions of the chromium-containing material, respectively;
forming a first mask which covers at least some of the second portion of the chromium-containing material and leaves at least some of the first portion of the chromium-containing material exposed, the first mask having a first thickness;
thinning the exposed chromium-containing material while protecting the remainder of the chromium-containing material with the first mask; after the thinning, at least some of the chromium-containing material within the boundary area being thicker than at least some of the chromium-containing material within the main-field area;
removing the first mask, and thereafter forming a second mask which is patterned over the thinned chromium-containing material across the main-field area, the second mask having a second thickness which is less than the first thickness; and
transferring the pattern from the second mask into the main-field area to pattern the first material.

3. The method of claim 2 further comprising:
removing the second mask; and
subjecting the thinned chromium-containing material of the first portion to an etch after the removal of the second mask, the etch removing the thinned chromium-containing material of the first portion.

4. The method of claim 2 wherein the exposed first portion is an entirety of the first portion.

5. The method of claim 2 wherein the exposed first portion is less than an entirety of the first portion.

6. The method of claim 2 wherein the covered second portion is an entirety of the second portion.

7. The method of claim 2 wherein the covered second portion is less than an entirety of the second portion.

8. The method of claim 2 wherein the covered second portion is less than an entirety of the second portion, and wherein the only segments of the second portion which are not covered by the first mask are segments in locations where alignment markings are to be formed.

9. The method of claim 2 wherein the first material comprises one or more of silicon nitride, silicon oxynitride, molybdenum silicide, and $Mo_wSi_xN_yO_z$; wherein w, x, y and z are numbers greater than zero.

10. The method of claim 2 wherein the transferring the pattern from the second mask into the main-field area comprises:
   transferring the pattern from the second mask into the thinned chromium-containing material with a first etch; and
   utilizing the first portion of the thinned chromium-containing material as a hard mask while transferring the pattern into the first material with a second etch.

* * * * *

UNITED STATES PATENT AND TRADEMARK OFFICE
CERTIFICATE OF CORRECTION

PATENT NO. : 7,556,897 B2
APPLICATION NO. : 12/196144
DATED : July 7, 2009
INVENTOR(S) : Baorui Yang It is certified that error appears in the above-identified patent and that said Letters Patent is hereby corrected as shown below:

In column 10, line 65, in Claim 3, delete "etchafter" and insert -- etch after --, therefor.

In column 11, line 1, in Claim 4, delete "firstportion" and insert -- first portion --, therefor.

In column 11, line 6, in Claim 6, delete "coveredsecond" and insert -- covered second --, therefor.

In column 12, line 5, in Claim 10, delete "transferringthe" and insert -- transferring the --, therefor.

In column 12, line 9, in Claim 10, delete "chromium-containingmaterial" and insert -- chromium-containing material --, therefor.

Signed and Sealed this

Eighteenth Day of August, 2009

David J. Kappos
*Director of the United States Patent and Trademark Office*